United States Patent
Kroyan et al.

(10) Patent No.: US 7,568,179 B1
(45) Date of Patent: Jul. 28, 2009

(54) LAYOUT PRINTABILITY OPTIMIZATION METHOD AND SYSTEM

(76) Inventors: Armen Kroyan, 855 Folsom St., #906, San Francisco, CA (US) 94107; Julia Kroyan, 855 Folsom St., #906, San Francisco, CA (US) 94107

( * ) Notice: Subject to any disclaimer, the term of this patent is extended or adjusted under 35 U.S.C. 154(b) by 159 days.

(21) Appl. No.: 11/523,947

(22) Filed: Sep. 21, 2006

(51) Int. Cl.
*G06F 17/50* (2006.01)

(52) U.S. Cl. .................... 716/19; 716/2; 716/7

(58) Field of Classification Search ............ 716/2, 716/7, 19

See application file for complete search history.

(56) References Cited

U.S. PATENT DOCUMENTS

| | | | |
|---|---|---|---|
| 6,189,132 B1 | 2/2001 | Heng et al. | |
| 6,473,882 B2 | 10/2002 | Mukai | |
| 6,507,931 B2 | 1/2003 | Kotani et al. | |
| 6,928,634 B2 | 8/2005 | Granik et al. | |
| 7,245,354 B2 * | 7/2007 | Granik | 355/67 |

* cited by examiner

*Primary Examiner*—Thuan Do

(57) ABSTRACT

A layout printability optimization method and system is presented that may be used for enhancing the manufacturability and yield of integrated circuits. The method is based on a mathematical framework, which describes and solves layout printability problems using nonlinear numerical optimization techniques. The means to define an optimization objective, constraint functions, compute function derivatives, and solve the resulting system, are also presented.

18 Claims, 9 Drawing Sheets

$$g(s) = \begin{pmatrix} \frac{\delta f}{\delta s_1}(s) \\ \vdots \\ \frac{\delta f}{\delta s_n}(s) \end{pmatrix}$$

Figure 7

$$H(s) = \begin{pmatrix} \frac{\delta^2 f}{\delta^2 s_1}(s) & \frac{\delta^2 f}{\delta s_1 \delta s_2}(s) & \cdots & \frac{\delta^2 f}{\delta s_1 \delta s_n}(s) \\ \frac{\delta^2 f}{\delta s_2 \delta s_1}(s) & \frac{\delta^2 f}{\delta^2 s_2}(s) & \cdots & \frac{\delta^2 f}{\delta s_2 \delta s_n}(s) \\ \vdots & & \ddots & \vdots \\ \frac{\delta^2 f}{\delta s_n \delta s_1}(s) & & \cdots & \frac{\delta^2 f}{\delta^2 s_n}(s) \end{pmatrix}$$

Figure 8

$$\begin{pmatrix} \frac{\delta c_1}{\delta s_1}(s) & \frac{\delta c_1}{\delta s_2}(s) & \cdots & \frac{\delta c_1}{\delta s_n}(s) \\ \frac{\delta c_2}{\delta s_1}(s) & \frac{\delta c_2}{\delta s_2}(s) & \cdots & \frac{\delta c_2}{\delta s_n}(s) \\ \vdots & & \ddots & \vdots \\ \frac{\delta c_m}{\delta s_1}(s) & \frac{\delta c_m}{\delta s_2}(s) & \cdots & \frac{\delta c_m}{\delta s_n}(s) \end{pmatrix}$$

Figure 9

$$\begin{pmatrix} \frac{\delta p_1}{\delta s_1}(s) & \frac{\delta p_1}{\delta s_2}(s) & \cdots & \frac{\delta p_1}{\delta s_n}(s) \\ \frac{\delta p_2}{\delta s_1}(s) & \frac{\delta p_2}{\delta s_2}(s) & \cdots & \frac{\delta p_2}{\delta s_n}(s) \\ \vdots & & \ddots & \vdots \\ \frac{\delta p_k}{\delta s_1}(s) & \frac{\delta p_k}{\delta s_2}(s) & \cdots & \frac{\delta p_k}{\delta s_n}(s) \end{pmatrix}$$

Figure 10

$$\begin{pmatrix} \frac{\delta^2 c_i}{\delta^2 s_1}(s) & \frac{\delta^2 c_i}{\delta s_1 \delta s_2}(s) & \cdots & \frac{\delta^2 c_i}{\delta s_1 \delta s_n}(s) \\ \frac{\delta^2 c_i}{\delta s_2 \delta s_1}(s) & \frac{\delta^2 c_i}{\delta^2 s_2}(s) & \cdots & \frac{\delta^2 c_i}{\delta s_2 \delta s_n}(s) \\ \vdots & & \ddots & \vdots \\ \frac{\delta^2 c_i}{\delta s_n \delta s_1}(s) & \cdots & & \frac{\delta^2 c_i}{\delta^2 s_n}(s) \end{pmatrix}$$

Figure 11

LAYOUT PRINTABILITY OPTIMIZATION METHOD AND SYSTEM

FIELD OF THE INVENTION

The present invention relates to layout printability optimization methods implemented in software programs for improving the manufacturability and yield of semiconductor integrated circuits.

BACKGROUND OF THE INVENTION

The following U.S. Pat. Nos. 6,189,132, 6,473,882, 6,507,931, and 6,928,634 are believed to represent the current state of the art. These patents all relate to prior art with respect to the current patent.

The above patents describe techniques to improve the printability of mask photolithography as it pertains to the manufacture of integrated circuits.

Over the past several decades, integrated circuit (IC) manufacturing has been based on the optical pattern transfer process called photolithography. A completed IC design layout is captured in a form of multiple design layers corresponding to various processing steps involved in a formation of semiconductor devices in silicon. Each of the sequential processing steps requires a photomask which captures the circuit patterns of a given design layer (or a combination of several layers). A lithographic imaging system uses the photomask as the master object which image is optically transferred onto the silicon substrate covered with a photosensitive material. The resultant optical image triggers a photochemical reaction, which, after development and etching steps, leads to the formation of the semiconductor device structures.

With the continuing shrinkage of the IC devices, the lithographic process has become increasingly challenging. As circuit pattern dimensions became smaller than the wavelength of light used for their imaging, the optical pattern transfer process approached its fundamental resolution limits and became highly nonlinear. This patterning mode, known as sub-wavelength lithography, led to the emergence of various resolution enhancement technologies (RET) to cope with layout printability problems, which include a variety of issues related to the pattern transfer process. Such problems include but are not limited polygon edge placement errors, pattern distortions, pattern fidelity (i.e. image contrast, slope) reduced pattern tolerance to process variations (i.e. exposure dose, focus, aberrations, etc.), and printability hot spots, which significantly reduce the yield of the integrated circuit.

Optical Proximity Correction (OPC) is a resolution enhancement technology that modifies layout patterns to compensate for the optical and process proximity effects by minimizing the pattern edge placement errors (EPEs), that is to modify the layout patterns so as to minimize the error between the printed edges and the edges of the original layout pattern, typically called the uncorrected edges. In recent years, OPC has become the critical component of the mask data preparation process and is used routinely in the advanced IC manufacturing. Initially, OPC was based on a set of predetermined rules which defined the amount of polygon edge movement needed for a given pattern configuration. However, as the imaging non-linearities and the proximity effects increased, rule-based OPC was no longer sufficient and became replaced by a model-based approach. Model-based OPC technology uses lithography simulation to predict and compensate for the proximity effects. Although computationally more expensive than the rule-based method, the model-based OPC provides superior conversion results and avoids the need for generation of long and complex sets of rules.

As the industry moved into the deep sub-100 nm technology space, new printability challenges emerged. At the 65 nm technology node, even the application of the most advanced lithography technology and OPC tools leaves behind multiple localized layout instances with marginal printability known as hot spots. These hot spots have become one of the biggest limiting factors of the IC yield, and they threaten to become even more dominant of an issue as the industry moves into 45 nm technology and below. The OPC technology alone cannot cope with this problem due to the fundamental limitations of its underlying algorithms. Although OPC is an optimization problem, the existing solutions so far have relied on sub-optimal techniques, where layout polygon segments are individually adjusted, in a sequential order, until the EPE tolerances are met. Generally, this process involves the simulation-based calculation of various localized image properties from which the direction and the amount of movement for each polygon edge is estimated. For example, some of the more advanced OPC methodologies such as described by Granik, et. al. in U.S. Pat. No. 6,928,634 granted Aug. 9, 2005, have been utilizing partial derivative matrices of relevant printability criteria such as mask error enhancement factor (MEEF) to more accurately determine how to move individual polygon edges. Even though the general "trial and error" OPC approach in its various embodiments has worked sufficiently well to minimize the edge placement errors, it has reached its fundamental limitations in terms of the attainable convergence accuracy as well as its extendibility to solve more complex optimization problems.

Due to the limitations of the OPC technology, the industry has pursued various approaches to establish design trade-offs and generate additional or modified designed rules in order to tackle the hot spot printability problem. Such approaches include IC design techniques based on restricted design rules, utilization of layout compaction and other rule-based layout modification technologies.

Restricted design rule (RDR) methodology addresses the printability issues by introducing regularity to the IC layout. This approach allows to determine and eliminate design configurations and relevant rules that yield poor printability results. However, this benefit comes at a price of significantly reduced freedom of the designer to make optimal trade-offs between critical factors such as the circuit performance and area.

Layout modification technologies, such as compaction, have been previously described by Mukai in U.S. Pat. No. 6,473,882, granted Oct. 29, 2002, and some have used compaction to make the IC layout compliant to a set of design rules while minimizing a linear objective function as described by Heng et. al. in U.S. Pat. No. 6,189,132 granted Feb. 13, 2001. More recently, this technology has been adapted to deal with printability problems. Since the compaction technology is based on linear programming (also commonly referred to as linear optimization) combined with heuristic techniques, it requires linearization of the problem of interest. For example, printability hot spots can be addressed through the iterative modification of relevant design rules and the use of compaction to perturb the layout as described by Kotani et. al. in U.S. Pat. No. 6,507,931 granted Jan. 14, 2003. However, the application of such methodologies is very difficult due to the complexity associated with determining of how to modify the design rules to improve the printability.

The main reason why it is difficult to solve printability problems with the above mentioned technologies lies in the nonlinear nature of the printability phenomenon. The imaging process involved in the optical pattern transfer techniques used in lithography has a nonlinear functional relationship to the layout patterns on the photomask. Mathematically, using programming like notation, the lithographic imaging process may be expressed as equation 1 below:

$$I(x,y) = \text{Sum } \{\text{for } k=1 \text{ to } m \text{ of} |(Tk*U)(x,y)|^2\} \quad \text{[equation 1]},$$

where 'I' is the intensity of the output image printed on the wafer, (x,y) are the spacial coordinates at which the image intensity is calculated, 'U' is the spatial transmission intensity matrix of a given photomask, $\{Tk\}$, k=1 to m is the lithographic model. This equation constitutes the discretized formulation of the lithographic imaging based on the Hopkins partially coherent imaging theory. The model $\{Tk\}$ consists of a set of spacial convolution kernels, which are computed from the Hopkins transmission cross-coefficient (TCC) matrix. The TCC matrix fully describes a given imaging system, which depends on optical parameters such as wavelength of light, lens numerical aperture, the shape of the illuminator, defocus, etc. The model may be further calibrated to capture various process effects such as photoresist, etching, chemical-mechanical polishing, etc. The transmission intensity matrix represents the spacial transmission properties on the mask layout patterns.

Since various printability criteria such as EPE, MEEF, image contrast, etc., are derived from the image intensity, they are also inherently nonlinear with respect to the mask. As a result, printability optimization does not provide sufficient quality, accuracy and efficiency when using linear programming methods.

Thus, it is desirable to have a layout printability optimization system that would overcome the limitations of these existing printability optimization techniques, easily integrate with the IC design infrastructure, produce optimal results within a short amount of time and reduce the need for human intervention.

SUMMARY OF THE INVENTION

The present invention seeks to provide a methodology, which contrary to the prior art, applies advanced nonlinear optimization techniques to solve layout printability problems. This methodology overcomes the limitations of the prior art while producing layouts with enhanced manufacturability and yield.

There is thus provided, in accordance with a preferred embodiment of the present invention, a method and system for improving the printability of a plurality of polygons used in generating masks for the fabrication of an integrated circuit that include the steps of:

a) Segmenting said polygons into a plurality of segmented polygons,
b) Defining a non-linear objective function,
c) Using at least one non-linear programming method to minimize the objective function, and
d) Outputting a new set of segmented polygons, where step b) also includes, adding weights to the terms or the optimization criteria of the objective function, and creating at least one constraint equation for at least one segment of the segmented polygons.

Additionally, in accordance with a preferred embodiment of the present invention, at least one constraint equation is derived from at least one process design rule or from at least one constraint of the physical design of the integrated circuit.

It is also provided, in accordance with a preferred embodiment of the present invention, that step c) of the method further includes the steps of:

1) calculating the printability parameters,
2) computing said objective function,
3) evaluating said constraints,
4) computing derivatives of said objective function, and said constraints,
5) deriving an intermediate solution; and,
6) if said intermediate solution does not meet stopping criteria, repeating steps 1) through 6); and that the method may further include a step of partitioning the plurality of polygons prior to segmentation or segmented polygons following segmentation, where the subsequent steps b) and c) are iteratively applied to the partitions of the plurality of segmented polygons.

BRIEF DESCRIPTION OF THE DRAWINGS

The present invention will be understood and appreciated more fully from the following detailed description, taken in conjunction with the drawings in which:

FIG. 7 is a mathematical equation description a first derivative of an objective function;

FIG. 8 is a mathematical equation describing a second derivative of an objective function;

FIG. 9 is a matrix formulation of a first derivative of equality constraints;

FIG. 10 is a matrix formulation of a first derivative of inequality constraints; and FIG. 11 is a matrix formulation of a second derivative of equality constraints.

DETAILED DESCRIPTION OF VARIOUS EMBODIMENTS

The layout printability optimization method and system, described in the present invention, may be applied to an IC physical layout data that is subsequently used in mask data preparation and generation processes. This optimization methodology is applicable to various resolution enhancement technologies (RETs) currently used in the state-of-the-art lithography. For example, this optimization methodology may be used for binary "chrome-on-glass" masks and phase shifting masks (i.e. attenuated, alternating-aperture). Moreover, this methodology is complimentary to sub-resolution assist feature (scattering bar) techniques, and may be applied to multiple exposure techniques based on layout decomposition. It is also contemplated that the optimization methodology and system described herein may take advantage of layout hierarchy information provided with the IC layout data, for faster and more efficient layout processing, and that the optimization methodology and system preserves the original hierarchy whenever and as much as possible.

In a least one embodiment of the present invention, the disclosed methods for IC layout optimization may be implemented in a computer software system. Nevertheless, it is contemplated that the layout printability optimization method and system described in the present invention have greater utility, as they may be partially implemented in hardware as well as may include other functionality or components not described herein.

Figure 1:
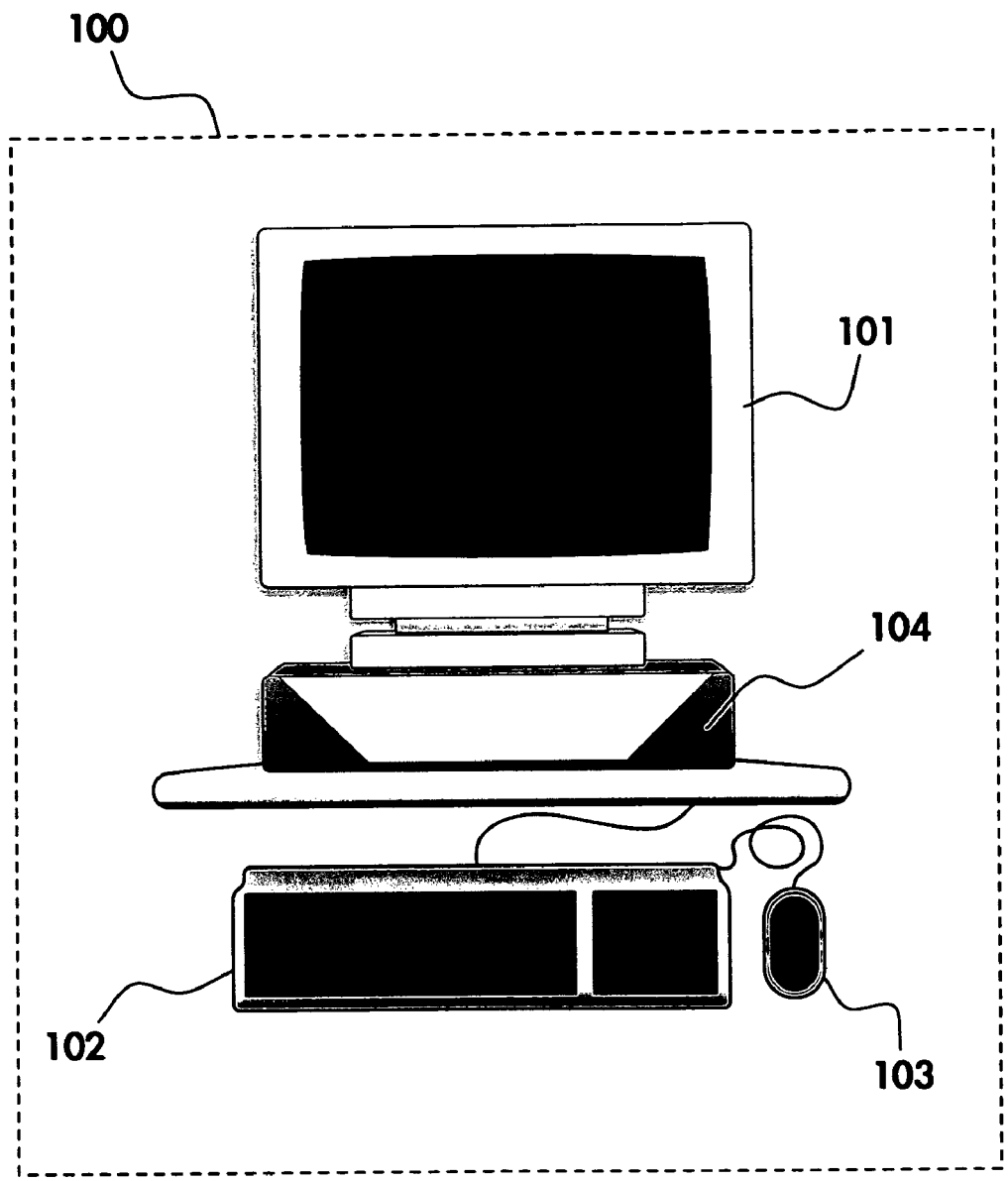
FIG. 1 is an illustration of a computer system used for the implementation and utilization of the disclosed method.

Reference is now made to FIG. 1, an illustration of a computer system, which may embody at least one embodiment of the disclosed layout printability optimization method implemented in a computer system in accordance with the present invention. The computer system 100 may include a visual display unit 101, a data input mechanism using devices such as a keyboard 102 and a mouse 103, and a processing unit 104. The processing unit 104 may further include a central processing unit (CPU), various persistent and removable storage devices such as a hard disks, and memory. In this example, the processing unit 104 may store the layout printability optimization software system and execute it based on instructions and relevant input data received on a computer readable media (i.e. CD, DVD) or communicated from a remote computer.

The layout printability optimization system may also be implemented on different types of computer systems, such as personal computers, workstations, client/server systems, and mainframe computers. Furthermore, at lease one embodiment of the disclosed methods may reside in multiple copies of such computer systems interconnected by wired or wireless means.

Figure 2:
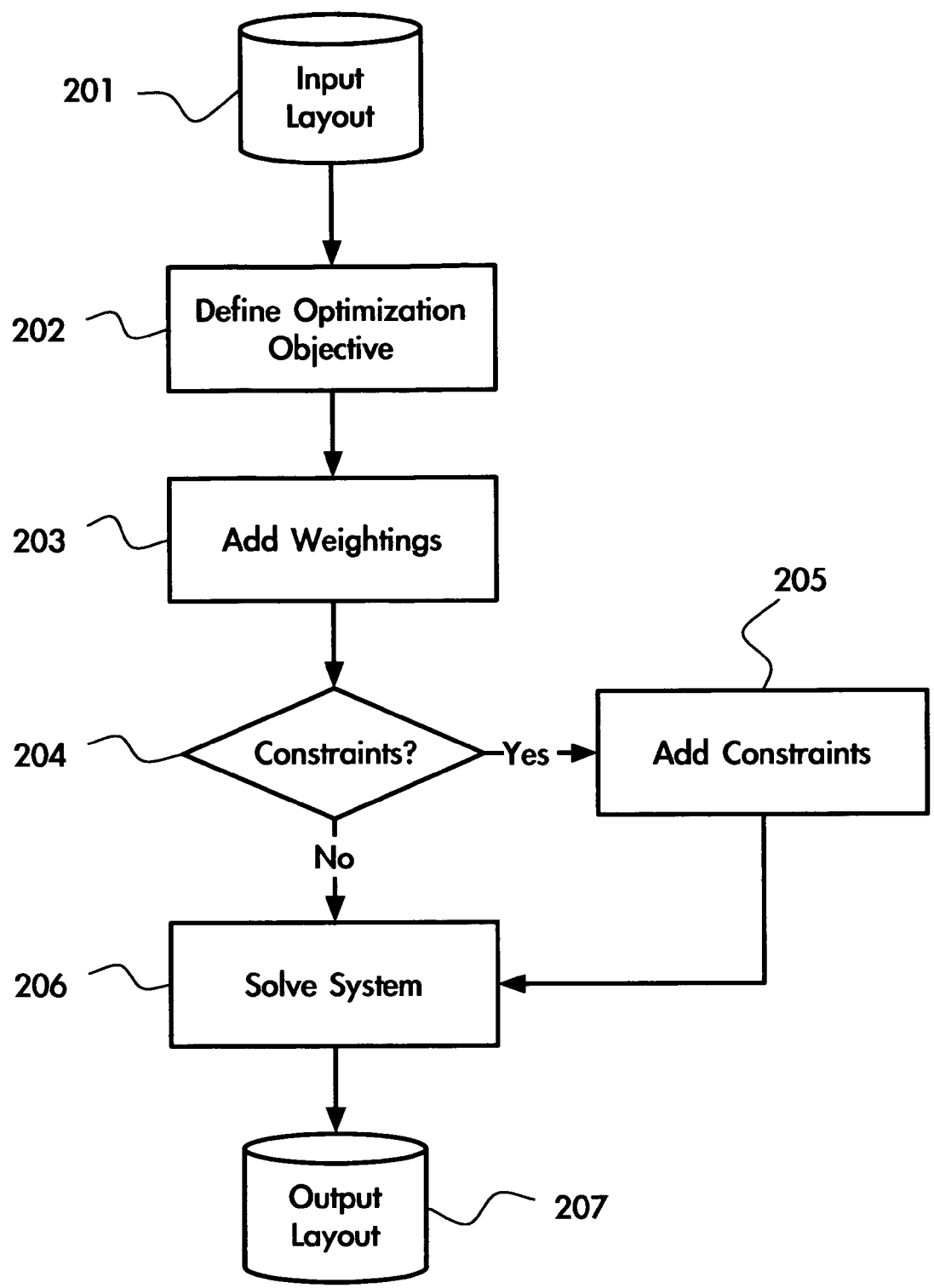
FIG. 2 is a simplified flow diagram of an embodiment of the disclosed method.

Reference is now made to FIG. 2, an illustration of the main components of the processing flow used in the optimization methodology of a preferred embodiment of the present invention. Steps 201 and 206 represent layout input and output respectively including the associated layout pre- and postprocessing. Such IC layout data, which captures the IC's physical or geometrical properties, may be accepted or produced in any number of formats including, but not limited to GDSII, OASIS, CIF, etc. Furthermore, the input layout data may represent a full chip, a design block, a standard cell, or just a small layout instance. In addition, the input layout may be translated into an internal representation (i.e. stored in a database) to provide adequate access to the layout data subjected to subsequent processing.

Figure 3:
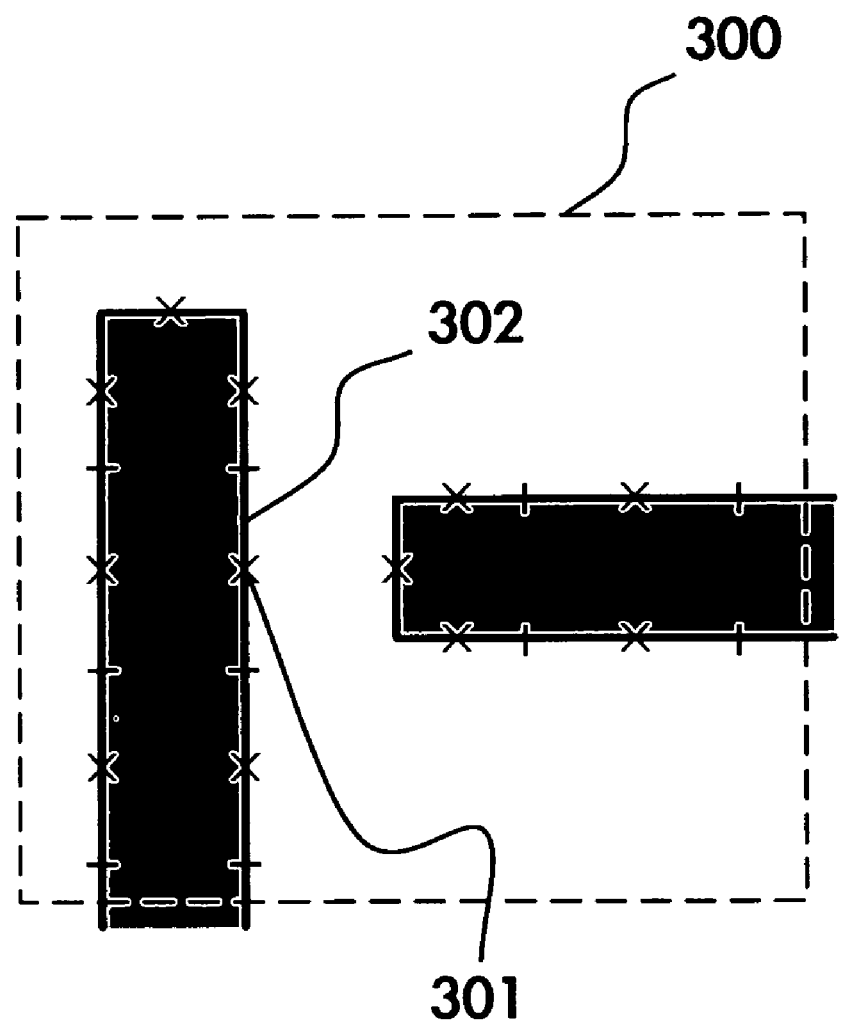
FIG. 3 is a simplified illustration of a portion of a mask layout containing segmented polygons and evaluation points.

Reference is now made to FIG. 3, an example of a portion of a mask layout 300 containing polygons with segmented edges. IC layouts are represented, in IC layout data, as a plurality of polygons. As is customary in typical OPC procedures, polygon edges need to be segmented in order to obtain a proper pattern sampling. An evaluation point (Xi, Yi) 301 (also known as simulation site) is assigned to a given polygon segment 'Si' 302. Typically, there is one evaluation point assigned per segment, but more than one point per edge segment may also be designated.

Individual polygon edge segments 'Si' constitute the optimization variables. All or a subset of segments may be subjected to optimization. If a given polygon segment does not have to be optimized or it has to remain unchanged, then this segment will not be treated as a variable. All of the segments that need to be optimized will be treated as optimization variables and will be processed by the optimization system with the goal of enhancing their printability.

Depending on the printability problem that needs to be solved, relevant printability criteria or parameters are used in the optimization process. Such parameters may include, but are not limited to, image intensity, image slope, image contrast, mask error enhancement factor (MEEF) and edge placement error (EPE). These parameters are calculated using simulation techniques, where a simulation model represents the pattern transfer process. In the case of optical photolithography, the simulation model may include but is not limited to, optical image formation effects (i.e. partially coherent imaging, focus, thin films, flair, lens aberrations, etc.), lithography process effects (photoresist post-exposure bake, development, etc.), etching, etc. If the pattern transfer process is based on a different technology, i.e. extreme-UV (EUV) lithography, e-beam lithography, etc., the simulation model would capture the relevant effects that accurately and sufficiently describe the properties of a given technology.

Reference is again made to FIG. 2. In step 202, for a given input layout subjected to optimization, an appropriate objective function is defined. Optimization objective may be viewed as a measure of the printability quality or goodness. It may be based on a single printability criterion, i.e. image contrast or slope, or a combination of multiple criteria, i.e. slope and EPE. Regardless of the printability criterion or a combination of thereof chosen, the optimization objective is always nonlinear due to the nature of the printability phenomenon. Multiple objective functions may be added together to form one objective function, however, the resultant objective function will always remain nonlinear since at least one of its components is nonlinear. The optimization objective is defined as a function that captures the collective contributions of all optimization variables.

For a given set of 'n' edge segments 'Si', $1 \leq i \leq n$, that are subjected to optimization, 'S' is defined as the vector containing all n edge segments, shown in equation 2 below:

$$S=(S1,\ldots,Sn). \qquad \text{[equation 2]}$$

It is important to note that since the edge segments 'S' represent the mask layout, or a portion of the mask layout, the mask transmission matrix 'U' used in image intensity calculations is a function of segments 'S', as shown in equation 3 below:

$$U=U(S). \qquad \text{[equation 3]}$$

Hence, this implies that the image intensity 'I(X,Y)', shown in equation 1, is also a nonlinear function of segments 'S'.

For each segment 'Si', $1 \leq i \leq n$, a function 'Fi(S)' represents a measure of a printability criterion of interest. The functions 'Fi(S)' are real and scalar-valued, and are nonlinear with respect to the layout segments 'S'. For example, 'Fi(S)' may be the edge placement error, image log-slope, etc.

Figure 4:
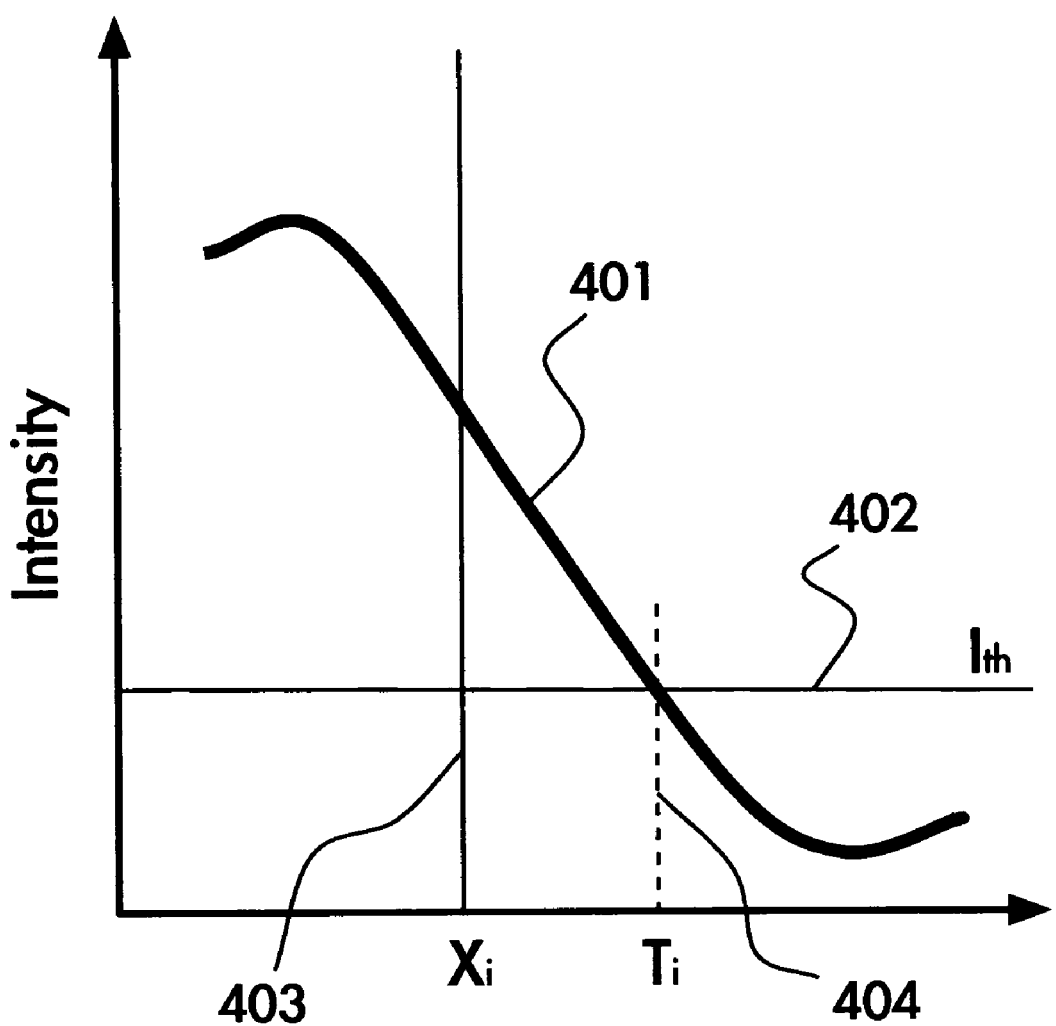
FIG. 4 is a graph of an intensity function about a segment edge.

Reference is now made to FIG. 4, an example of a horizontal cross-section of an image 401 corresponding to a vertical edge segment 'Si' at Y=Yi. The cross-section plane goes through the evaluation point (Xi, Yi). The intensity level 402 is the threshold intensity 'Ith', which defines the intensity value at which the polygon edges are printed. In this example, 'Ith' does not depend on the edge positions and is constant across the silicon wafer. The point 'Ti' (404) is the x-coordinate of the printed edge location for this cross-section (Y=Yi), and the point 'Xi' (403) is the x-coordinate of the evaluation point for the segment 'Si'.

The function 'Fi(S)' may be defined as the edge placement error (EPE) of the target edge 'Xi' (403), which is the difference between the target edge and its actual printed location 'Ti' (404). Such an objective function may be expressed as equation 4 below:

$$Fi(S)=Xi-Ti, \qquad \text{[equation 4]}$$

where 'Xi' is the x-coordinate of the original uncorrected edge, and for any given 'Xi', 'Ti' is the x-coordinate where the edge would be printed, as shown in equation 5 below:

$$I(Ti, Yi) = Ith.  \quad \text{[equation 5]}$$

The equation 5 implies that 'Ti' is a function of the intensity 'I', or in mathematical terms $$Ti = Ti(I). \quad \text{[equation 6]}$$

It is important to note that due to the nonlinearity of the intensity function 'I' with respect to the segments 'S', 'Ti' is also nonlinear in 'S'. Hence, the function 'Fi(S)', shown in equation 4, is also nonlinear.

In another example, the function 'Fi(S)' could be defined as the image log-slope shown in equation 7:

$$Fi(S) = d/dx\ [ln(I(x,Yi))]|x=Xi. \quad \text{[equation 7]}$$

'Fi(S)' is the first order partial derivative of the log of the intensity function with respect to 'x' at 'Xi'. In this case, the image log-slope is calculated at the point 'Xi' (403).

The objective 'F(S)' represents the function that will be optimized. Any valid objective function aggregates individual functions 'Fi(S)', $1 \leq i \leq n$ into a scalar of real value. For example, 'F(S)' may be the sum of the functions 'Fi(S)', as shown in equation 8:

$$F(S) = \text{Sum } \{\text{for } i=1 \text{ to } n \text{ of } Fi(S)\}. \quad \text{[equation 8]}$$

Due to the nonlinearity of 'Fi(S)', $1 \leq i \leq n$, the objective function 'F(S)' will be nonlinear in 'S' as well.

Reference is again made to FIG. 2. At step 203, weightings may be applied to the contributions of individual variables to the objective function. Weightings provide the user with an additional control over the outcome solution. For example, when starting with the objective function shown in equation 8 above, adding weights may create the weighted objective function shown in equation 9 below, where $Wi \geq 0$, $1 \leq i \leq n$ are the weights for each segment:

$$F(S) = \text{Sum } \{\text{for } i=1 \text{ to } n \text{ of } Wi*Fi(S)\}. \quad \text{[equation 9]}$$

Furthermore, the objective function may be a composite of several different criteria. The example shown in equation 10 below is a case of concurrent optimization of two printability criteria:

$$F(S) = A1*\text{Sum } \{\text{for } i=1 \text{ to } n \text{ of } Wi*Fi(S)\} + A2*\text{Sum } \{\text{for } i=1 \text{ to } n \text{ of } Vi*Gi(S)\}. \quad \text{[equation 10]}$$

Similarly to 'Fi(S)', the function 'Gi(S)', $1 \leq i \leq n$ represents another printability criterion and $Vi \geq 0$, $1 \leq i \leq n$ are the corresponding weights. The coefficients 'A1' and 'A2' are both non-negative ($A1, A2 \geq 0$) and are used as another type of a weighting to define the relative importance of each printability criterion. There may be more than two criteria that are optimized at the same time. Moreover, not all of the additional criteria need to be printability related or nonlinear.

Alternatively to equation 10, the weightings 'A1' and 'A2' may be added to the objective function in the form shown in equation 11 below:

$$F(S) = \text{Sum } \{\text{for } i=1 \text{ to } n \text{ of } [A1*Wi*Fi(S) + A2*Vi*Gi(S)]\}. \quad \text{[equation 11]}$$

Equation 10 and equation 11 are mathematically equivalent since the sum was used to aggregate the contributing functions 'Fi(s)' and 'Gi(s)'. However, this may not be the case for other aggregation methods, such as vector norms.

A given printability problem may be defined as an unconstrained or constrained optimization problem, which is determined in step 204. In the case of constrained optimization, step 205 adds one or more linear or/and nonlinear constraints to the system. For example, constraints may represent certain relevant geometric rules, typically related to the process design rules or the IC physical design, which the optimization variables have to satisfy. The process design rules may be associated with the mask making process or the IC manufacturing process. Constraints of the physical design of an integrated circuit may be related to the circuit timing, area or power.

Figure 5A:
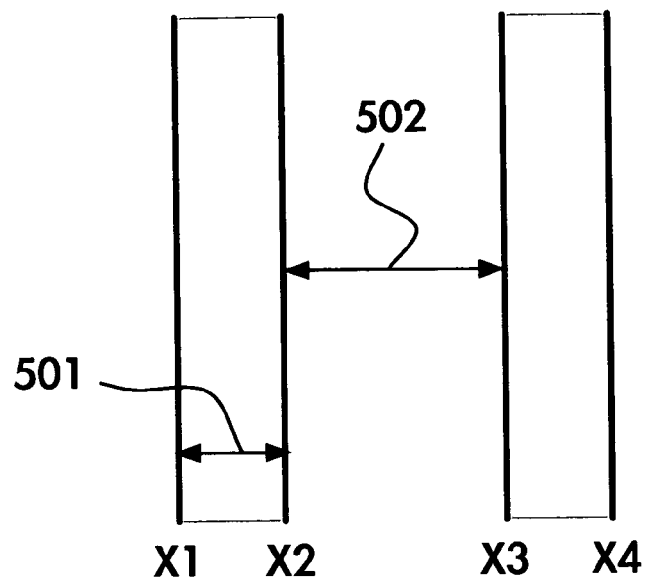
FIG. 5a illustrates examples of linear constraints related to polygons.

FIG. 5a illustrates examples of linear constraints, which may be equalities or inequalities. 501 is a linear constraint which defines the width of a layout shape. It may be expressed as equation 12, below:

$$X2 - X1 \geq A. \quad \text{[equation 12]}$$

In equation 12, 'X1' and 'X2' are the x-coordinates of appropriate feature vertices and 'A' is a constant. 502 is another linear constraint which defines the spacing between two layout shapes, which may be expressed as equation 13 below:

$$X3 - X2 \geq B. \quad \text{[equation 13]}$$

In equation 13, 'X2' and 'X3' are the x-coordinates of appropriate feature vertices and 'B' is a constant. For example, the constraints such as shown above may be derived from the process design rules, and limit how small the shapes and spaces between them may be.

Figure 5B:
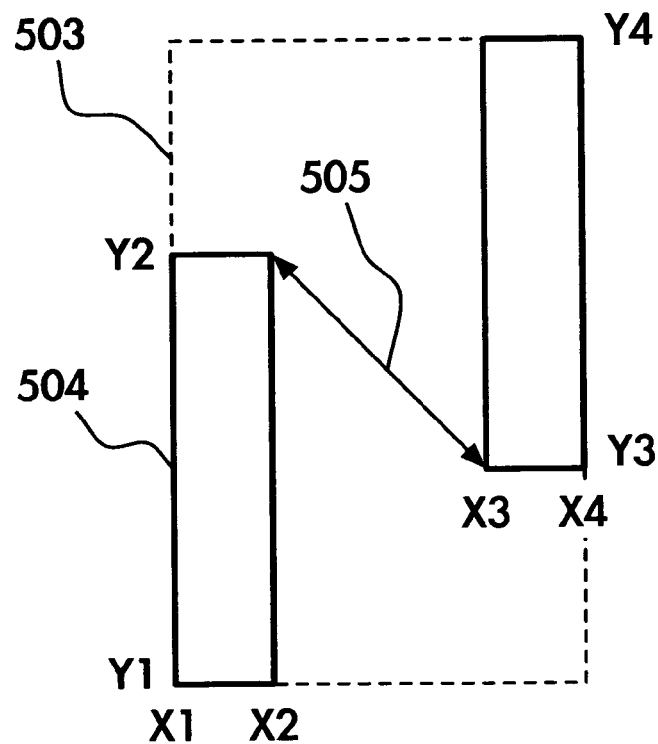
FIG. 5b illustrates examples of nonlinear constraints related to polygons.

On the other hand, FIG. 5b illustrates examples of nonlinear constraints. 503 is a nonlinear constraint that limits the area of a portion of the layout. Such a constraint may be derived from a constraint of the physical design of the integrated circuit. It may be useful to apply the physical design derived constraints, which otherwise may result in an expansion of the layout beyond what the physical design intended. Such a constraint is shown in equation 14, below:

$$(X4-X1)*(Y4-Y1) \leq C. \quad \text{[equation 14]}$$

In equation 14, (X1, Y1) and (X4, Y4) are the coordinates of appropriate feature vertices and 'C' is a constant. Similarly, constraint 504 limits the area of a shape, and may be expressed as equation 15:

$$(X2-X1)*(Y2-Y1) \leq D. \quad \text{[equation 15]}$$

Constraint 505 defines the euclidean distance between appropriate vertices of two layout shapes and is also nonlinear, as can be seen in equation 16, below:

$$\|(X3,Y3)-(X2,Y2)\|_2 = \text{sqrt}[(X3-X2)^2+(Y3-Y2)^2] \geq E. \quad \text{[equation 16]}$$

In equation 16, (X2, Y2) and (X3, Y3) are the coordinates of appropriate feature vertices and 'E' is a constant. The two constraints of the physical design shown in equations 15 and 16, may be derived from the timing constraints imposed on the physical design. Limiting the area of a shape or limiting the distance between two layout shapes may both be needed to limit delay increases in a critical path of the integrated circuit by limiting increases in capacitive loading due to printability corrections. In a similar fashion, other constraints of the physical design may be constructed from power constraints imposed on the physical design.

Problem formulations for unconstrained and constrained optimization are described below.

If there are no constraints, the optimization system to be solved is just the expression 1:

$$\min \{F(S)\} \text{ over } Si, 1 \leq i \leq n. \quad \text{[expression 1]}$$

Stating the optimization problem as a minimization of a function does not have any restrictions. The reason is that if a criteria needs to me maximized, minimizing the negative of the criteria yields the desired result.

In the case of constrained optimization, various types of constraints may be defined in the following manner. Any set of 'm' equality constraints may be written in the form shown in equation 17:

$$C(S)=B,\qquad\text{[equation 17]}$$

where $C(S)=(C1(s), \ldots, Cm(s))^T$ contains the equality constraint functions and $B=(B1 \ldots Bm)^T$ is the corresponding right-hand side. Thus, equation 18 is the i-th equality constraint.

$$Ci(S)=Bi.\qquad\text{[equation 18]}$$

Equivalently, the set of 'k' inequality constraints may be written as shown in equation 19:

$$P(S)\leq R,\qquad\text{[equation 19]}$$

where $P(S)=(P1(S), \ldots, Pk(s))^T$ contains the inequality constraint functions and $R=(R1,\ldots,Rk)^T$ is the corresponding right-hand side. Therefore, equation 20 is i-th inequality constraint:

$$Pi(S)\leq Ri.\qquad\text{[equation 20]}$$

This description of inequality constraints is not restrictive, since inequalities of the form $D(S)\geq A$ are equivalent to $-D(S)\leq -A$ and thus are captured by the above by defining $Pi(S)=-D(S)$ and $Ri=-A$.

Thus, the optimization system becomes the expression 1 and the equations 17 and 19, if such constraints exist. For convenience, the expression and equations are reproduced below:

$$\min \{F(S)\} \text{ over } Si, 1\leq i\leq n\qquad\text{[expression 1]}$$

$$\text{subject to } C(S)=B\qquad\text{[equation 17]}$$

and $$P(S)\leq R.\qquad\text{[equation 19]}$$

Clearly, as with big M techniques in linear programming, if penalty or barrier function methods are used in the solution of the constrained nonlinear optimization system, the objective function and the violations of the constraints are combined into a penalty or barrier function, which may be optimized using unconstrained optimization methods. In other words, solving the constrained optimization system is replaced by solving a sequence of unconstrained optimization problems. The violations of the equality constraints are simply measured by the expression 2 below:

$$\|C(S)-B\|.\qquad\text{[expression 2]}$$

The violations of the inequality constraints may be defined by the vector $V(S)$ for which each element $Vi(S)$, $i=1,\ldots,k$ measures the violation of the i-th inequality constraint where each 'Vi' takes on the form shown in equation 21:

$$Vi(S)=\max \{Pi(S)-R,0\}.\qquad\text{[equation 21]}$$

The penalty function may then be defined as shown in equation 22 below:

$$P(S,p)=F(S)+p^*(\|C(S)-B\|+\|V(S)\|).\qquad\text{[equation 22]}$$

In equation 22, the non-negative scalar 'p' is called the penalty parameter. Typically, 'P(S, p)' is optimized for a sequence of increasing values of 'p' using an unconstrained minimization method. In general, the sequence of solutions that optimize 'P(S, p)' will converge to the solution of the original constrained optimization system.

Reference is again made to FIG. 2. Steps 202, 203 and 205 constitute the definition phase of the optimization process, and result in the generation of the optimization system, which is then solved at the step 206. The resultant solution represents the modified layout with enhanced printability, which is output in the step 207.

Figure 6:
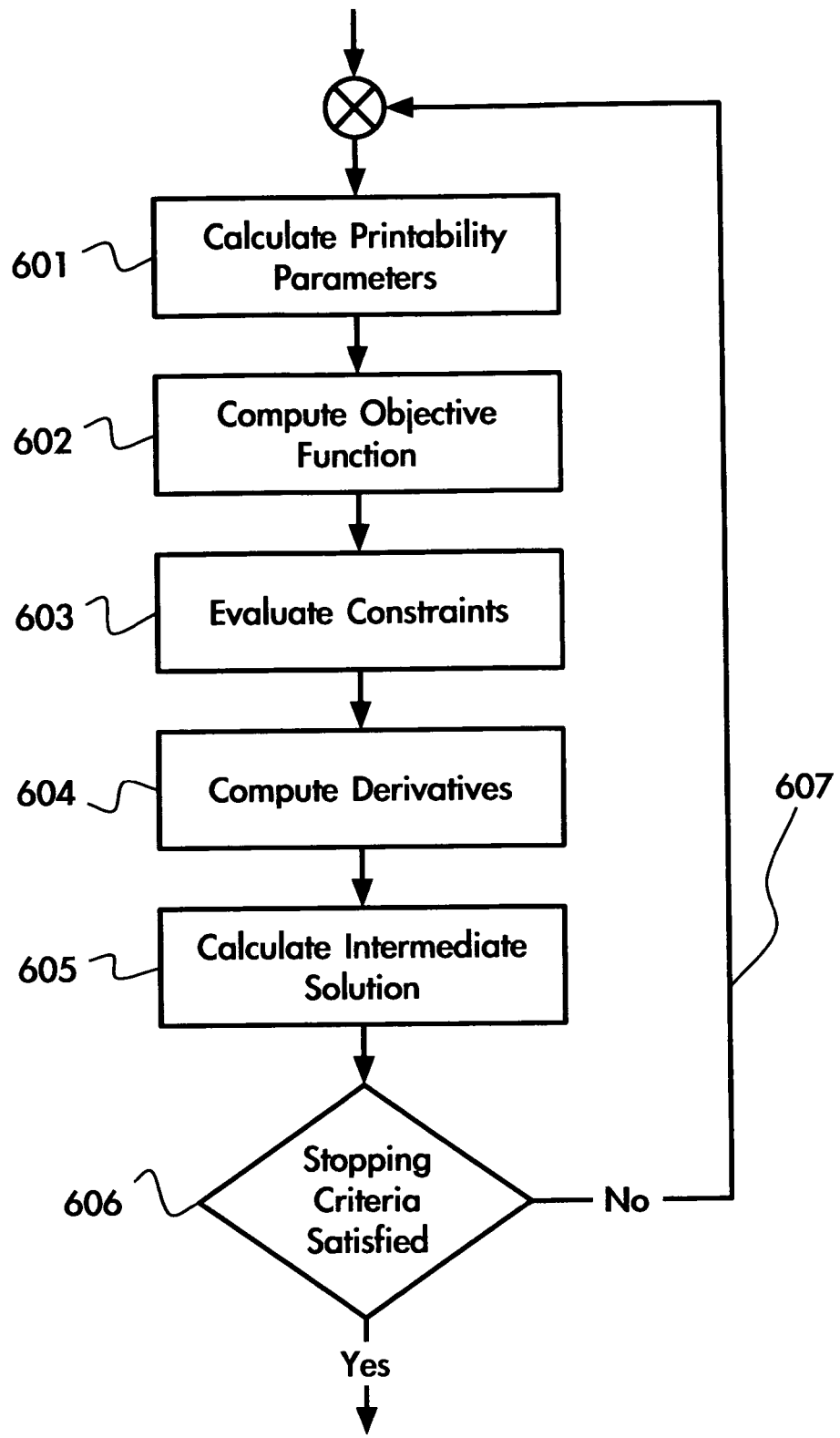
FIG. 6 is a more detailed flow diagram of the solving of the optimization system of the disclosed method.

Reference is now made to FIG. 6, which illustrates the major processing steps involved in the solving of the optimization system. At step 601, for a given layout 'S' subjected to optimization, relevant printability criteria or parameters (for example, 'Fi(S)' of equation 4 or equation 7), are calculated for each optimization variable using computer simulation. It is assumed that these parameters are computed at the pre-defined evaluation points. Based on these parameters, the value of the objective function 'F(S)' is computed during the step 602. In case of constrained optimization problem, step 603 evaluates the constraints by computing the values of vectors 'C(S)' and 'P(S)' for the given layout 'S'. In order to solve the optimization system, derivatives of the objective function and the constraints, in case of their presence, are computed with respect to the individual system variables 'Si' in step 604. Depending on the nonlinear optimization method used to solve the problem (for example, variations of Newton's method, Lagrange multiplier methods, etc.), first or first and second order derivatives of the objective function F(S) and the constraints 'C(S)' and 'P(S)' may be needed.

The first order derivative of the objective function 'F(S)' is represented by the gradient vector 'g(s)' of partial derivatives as shown in FIG. 7. The second derivative of the objective function 'F(S)' is represented by the symmetric matrix 'H(s)' shown in FIG. 8. The first derivative of the equality constraints with respect to 'S' is defined as the following matrix of partial derivatives as shown in FIG. 9, and equivalently, for the inequalities, we have the matrix shown in FIG. 10. The second order derivatives of the constraints may be computed analogously to the second order derivatives of the objective function 'F(s)'. The second derivative for each equality 'Ci(s)', $1\leq i\leq m$ with respect to 'S' is defined as shown in FIG. 11. Second derivatives of the inequality constraints follow similarly to the equality constraints. All of the above mentioned derivatives may be calculated analytically or using numerical approximations.

Reference is again made to FIG. 6. At step 605, the system intermediate solution is computed using appropriate mathematical methods. Such methods may include a variety of iterative solvers appropriate for unconstrained and constrained optimization problems (for example, variations of Newton's method, penalty function methods, interior point methods, Lagrange multiplier methods, etc.). Step 606 checks whether the optimization stopping criteria are satisfied or not after a given iteration. Stopping criteria may include predefined convergence tolerance, maximum number of iterations, elapsed time, etc. Meeting any number of such criteria, in any specific order, may be required to satisfy the stopping criteria. If the stopping criteria are satisfied, the solution corresponding to the current iteration constitutes the modified layout with enhanced printability, which is output (step 207 in FIG. 2). Otherwise, path 607 is taken, and the intermediate solution from the previous iteration is used as the layout 'S' in the next iteration. Steps 601 through 607 are repeated until a satisfactory solution is achieved.

Lastly, it should be noted that mask data for large integrated circuits may contain many millions of polygons. Such complexity exceeds the reasonable computation of all nonlinear programming methods in existence today. Still, the proximity effects being corrected by this method are highly limited in the region around the edges being adjusted, and therefore may be dealt with in a piecewise fashion. As such, in yet another embodiment of the present invention, the polygon data may be partitioned either along hierarchical lines, regular regional boundaries, or wherever area constraints or fixed structures limit the adjustment of segments beyond a specific region. Such partitioning may divide up the set of polygons into manageable sets, which may then be processed, one partition at a time, using the method described above. Furthermore, a system of computers may be used, each containing software, to apply the disclosed methods to multiple sets of polygons in parallel.

It will be appreciated by persons skilled in the art that the present invention is not limited by what has been particularly shown and described herein-above. Rather the scope of the present invention includes both combinations and sub-combinations of various features described herein-above as well as modifications and variations which would occur to persons skilled in the art upon reading the foregoing description and which are not in the prior art.

We claim:

1. A method for improving the printability of a plurality of polygons used in generating masks for the fabrication of an integrated circuit, said method including the steps of:
   a) Segmenting said polygons into a plurality of segmented polygons using a computer processor,
   b) Defining a nonlinear objective function;
   c) Using at least one nonlinear programming method to minimize said nonlinear objective function, wherein this step further includes the steps of:
      c1) calculating the printability parameters;
      c2) computing said nonlinear objective function;
      c3) evaluating the constraints;
      c4) deriving an intermediate solution; and
      c5) if said intermediate solution does not meet stopping criteria, repeating steps c1) through c5); and
   d) Outputting a new set of said plurality of segmented polygons.

2. A method as in claim 1, wherein step b) further includes adding weights to the terms of said nonlinear objective function.

3. A method as in claim 1, wherein step b) further includes adding weights to the criteria of said nonlinear objective function.

4. A method as in claim 1, wherein step b) further includes creating at least one constraint equation for at least one segment of said plural of segmented polygons.

5. A method as in claim 4, wherein said at least one constraint equation is derived from at least one process design rule.

6. A method as in claim 4, wherein said at least one constraint equation is derived from at least one constraint of the physical design of said integrated circuit.

7. A method as in claim 1, wherein said step c2) further includes the steps of:
   computing derivatives of said nonlinear objective function; and
   wherein said c3) further includes the step of computing derivatives of said constraints.

8. A method as in claim 1,
   wherein step a) further includes the step of partitioning said plurality of polygons prior to segmenting said polygons; and
   wherein said steps b) and c) are applied to each of said partitions of said plurality of segmented polygons.

9. A method as in claim 1,
   wherein step a) further includes the step of partitioning said plurality of segmented polygons; and
   wherein said steps b) and c) are applied to each of said partitions of said plurality of segmented polygons.

10. A system for improving the printability of a plurality of polygons used in generating masks for the fabrication of an integrated circuit, said system comprising:
    means to segment said polygons into a plurality of segmented polygons,
    means to define a nonlinear optimization system including a nonlinear objective function;
    means to use at least one nonlinear programming method to minimize said nonlinear objective function, further comprising:
       means to calculate the printability parameters;
       means to compute said nonlinear objective function;
       means to evaluate the constraints;
       means to derive an intermediate solution; and
       means to iterate until stopping criteria are met; and
    means to output a new set of said plurality of segmented polygons.

11. A system according to claim 10, wherein said nonlinear optimization system further includes means to add weights to the terms of said nonlinear objective function.

12. A system according to claim 10, wherein said nonlinear optimization system further includes means to add weights to the criteria of said nonlinear objective function.

13. A system according to claim 10, wherein said nonlinear optimization system further includes means to create at least one constraint equation for at least one segment of said plurality of segmented polygons.

14. A system according to claim 13, wherein said at least one constraint equation is derived from at least one process design rule.

15. A system according to claim 13, wherein said at least one constraint equation is derived from at least one constraint of the physical design of said integrated circuit.

16. A system according to claim 10, wherein said means to compute said nonlinear objective function, further includes:
    means to compute derivatives of said nonlinear objective function; and
    wherein said means to evaluate said constraints further includes means to compute derivatives of said constraints.

17. A system according to claim 10,
    wherein said means to segment said polygons into a plurality of segmented polygons further includes partitioning said plurality of polygons prior to segmenting said polygons; and
    wherein said means to define a nonlinear optimization system and said means to use at least one nonlinear programming method are applied to each of said partitions of said plurality of segmented polygons.

18. A system according to claim 10,
    wherein said means to segment said polygons into a plurality of segmented polygons further includes partitioning said plurality of segmented polygons; and
    wherein said means to define a nonlinear optimization system and said means to use at least one nonlinear programming method are applied to each of said partitions of said plurality of segmented polygons.

* * * * *